US005764567A

United States Patent [19]
Parkin

[11] Patent Number: 5,764,567
[45] Date of Patent: *Jun. 9, 1998

[54] MAGNETIC TUNNEL JUNCTION DEVICE WITH NONFERROMAGNETIC INTERFACE LAYER FOR IMPROVED MAGNETIC FIELD RESPONSE

[75] Inventor: Stuart Stephen Papworth Parkin, San Jose, Calif.

[73] Assignee: International Business Machines Corporation, Armonk, N.Y.

[*] Notice: The term of this patent shall not extend beyond the expiration date of Pat. No. 5,650,958.

[21] Appl. No.: 758,614

[22] Filed: Nov. 27, 1996

[51] Int. Cl.$^6$ ............................................... G11C 11/15
[52] U.S. Cl. ............................................ 365/173; 365/171
[58] Field of Search ............................................ 365/171, 173

[56] References Cited

U.S. PATENT DOCUMENTS

| | | | |
|---|---|---|---|
| 3,623,038 | 11/1971 | Franklin et al. | 340/174 TF |
| 5,055,158 | 10/1991 | Gallagher et al. | 156/643 |
| 5,432,734 | 7/1995 | Kawano et al. | 365/158 |
| 5,640,343 | 6/1997 | Gallagher et al. | 365/171 |
| 5,650,958 | 7/1997 | Gallagher et al. | 365/173 |

FOREIGN PATENT DOCUMENTS

WO 95/10123  4/1995  WIPO .................. H01L 43/08

OTHER PUBLICATIONS

J. M. Daughton, "Magnetoresistive Memory Technology", *Thin Solid Films*, vol. 216, 1992, pp. 162–168.

G. R. Harp et al., "Seeded Epitaxy of Metals by Sputter Deposition", *Applied Physics Letters*, vol. 65, No. 24, Dec. 12, 1994, pp. 3063–3065.

M. Juliere, "Tunneling Between Ferromagnetic Films", *Physics Letters*, vol. 54A, No. 3, Sep. 8, 1975, pp. 225–226.

K. P. Kämper et al., "$CrO_2$—A New Half–metallic Ferromagnet?", *Physical Review Letters*, vol. 59, No. 24, Dec. 14, 1987, pp. 2788–2791.

M. B. Ketchen et al., "Sub–μm Linewidth Input Coils for Low $T_c$ Integrated Thin–Film DC Superconducting Quantum Interference Devices", *Applied Physics Letters*, vol. 61, No. 3, Jul. 20, 1992, pp. 336–338.

K. Matsuyama et al., "Fabrication of Microstructured Magnetic Tunneling Valve Junction", *IEEE Transactions on Magnetics*, vol. 31, No. 6, Nov. 1995, pp. 3176–3178.

R. Meservey et al., "Spin–polarized Electron Tunneling", *Physics Reports*, vol. 238, No. 4, 1994, pp. 214–217.

T. Miyazaki et al., "Large Magnetoresistance Effect i 82Ni–Fe/Al–$Al_2O_3$/Co Magnetic Tunneling Junction", *Journal of Magnetism and Magnetic Materials*, vol. 98, 1991, pp. L7–L9.

(List continued on next page.)

*Primary Examiner*—David C. Nelms
*Assistant Examiner*—Michael T. Tran
*Attorney, Agent, or Firm*—Thomas R. Berthold

[57] ABSTRACT

A magnetic tunnel junction device, usable as a memory cell or an external magnetic field sensor, has a tunneling magnetoresistance response, as a function of applied magnetic field, that is substantially symmetric about zero field. The magnetic tunnel junction is made up of two ferromagnetic layers, one of which has its magnetic moment fixed and the other of which has its magnetic moment free to rotate, an insulating tunnel barrier layer between the ferromagnetic layers for permitting tunneling current perpendicularly through the layers, and a nonferromagnetic layer located at the interface between the tunnel barrier layer and one of the ferromagnetic layers. The nonferromagnetic layer increases the spacing between the tunnel barrier layer and the ferromagnetic layer at the interface and thus reduces the magnetic coupling between the fixed and free ferromagnetic layers, which has been determined to be the cause of unsymmetric tunneling magnetoresistance response about zero field. Even though the nonferromagnetic interface layer presents nonspin–polarized electronic states at the tunnel barrier layer interface, it unexpectedly does not cause a suppression of the tunneling magnetoresistance.

21 Claims, 12 Drawing Sheets

OTHER PUBLICATIONS

T. Miyazaki et al., "Giant Magnetic Tunneling Effect in Fe/Al$_2$O$_3$/Fe Junction", *Journal of Magnetism and Magnetic Materials*, vol. 139, 1995, pp. L231–L234.

J. S. Moodera et al., "Variation of the Electron-spin Polarization in EuSe Tunnel Junctions From Zero to Near 100% in a Magnetic Field", *Physical Review Letters*, vol. 70, No. 6, Feb. 8, 1993, pp. 853–856.

J. S. Moodera et al., "Large Magnetoresistance at Room Temperature in Ferromagnetic Thin Film Tunnel Junctions", *Physical Review Letters*, vol. 74, No. 16, Apr. 17, 1995, pp. 3273–3276.

J. S. Moodera et al., "Ferromagnetic–insulator–ferromagnetic Tunneling: Spin–dependent Tunneling and Large Magnetoresistance in Trilayer Junctions", *Journal of Applied Physics*, vol. 79, No. 8, Apr. 15, 1996, pp. 4724–4729.

J. S. Moodera et al., "Geometrically Enhanced Magnetoresistance in Ferromagnet–Insulator–Ferromagnet Tunnel Junctions", *Applied Physics Letters*, vol. 69, No. 5, Jul. 29, 1996, pp. 708–710.

S. S. P. Parkin, "Origin of Enhanced Magnetoresistance of Magnetic Multilayers: Spin–dependent Scattering From Magnetic Interface States", *Physical Review Letters*, vol. 71, No. 10, Sep. 6, 1993, pp. 1641–1644.

J. C. Slonczewski, "Magnetic Bubble Tunnel Detector", *IBM Technical Disclosure Bulletin*, vol. 19, No. 6, Nov. 1976, pp. 2328–2330.

J. C. Slonczewski, "Magnetic–field Tunnel–sensor", *IBM Technical Disclosure Bulletin*, vol. 19, No. 6, Nov. 1976, pp. 2331–2332.

J. C. Slonczewski, "Magnetic–barrier Current Amplifier", *IBM Technical Disclosure Bulletin*, vol. 19, No. 6, Nov. 1976, pp. 2333–2336.

C. Tsang et al., "Design, Fabrication & Testing of Spin–valve Read Heads for High Density Recording", *IEEE Transactions on Magnetics*, vol. 30, No. 6, Nov. 1994, pp. 3801–3806.

R. Wiesendanger et al., "Observation of Vacuum Tunneling of Spin–polarized Electrons with the Scanning Tunneling Microscope", *Physical Review Letters*, vol. 65, No. 2, Jul. 9, 1990, pp. 247–250.

T. Yaoi et al., "Dependence of Magnetoresistance on Temperature and Applied Voltage in a 82Ni–Fe/Al–Al$_2$O$_3$/Co Tunneling Junction", *Journal of Magnetism and Magnetic Materials*, vol. 126, 1993, pp. 430–432.

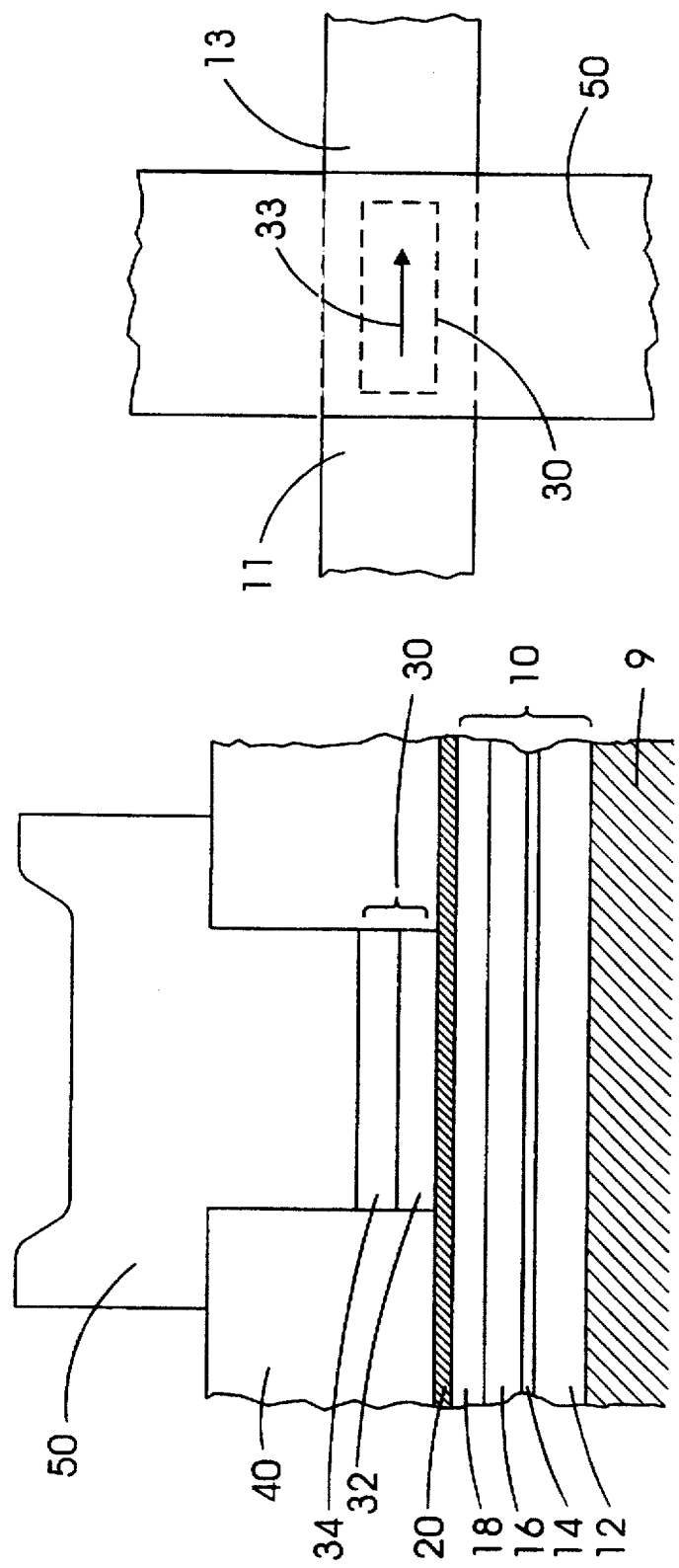

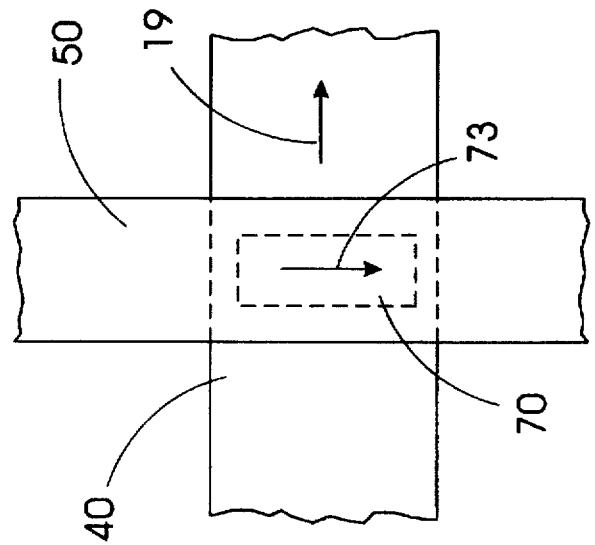
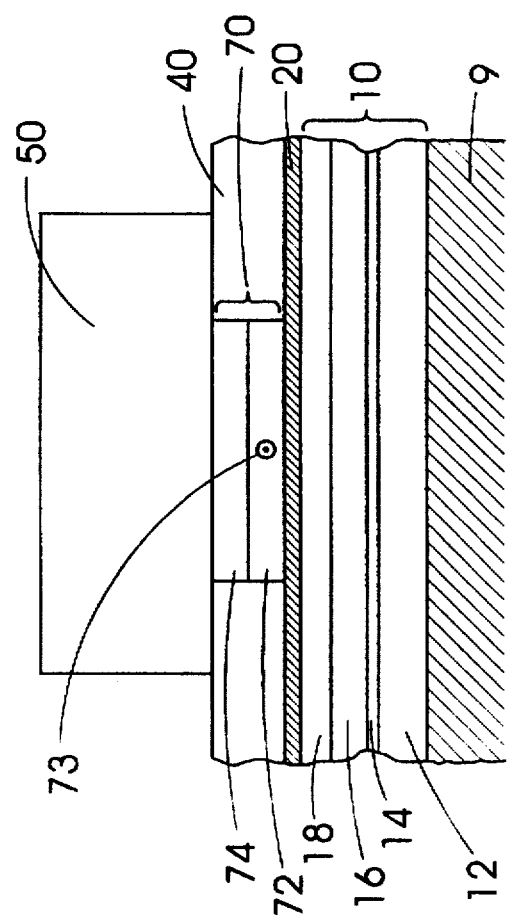
FIG. 2B
FIG. 2A

MAGNETIC TUNNEL JUNCTION DEVICE WITH NONFERROMAGNETIC INTERFACE LAYER FOR IMPROVED MAGNETIC FIELD RESPONSE

This invention was made with Government support under Contract MDA 972-96-C0014 awarded by the Advanced Research Projects Agency. The Government has certain rights in this invention.

TECHNICAL FIELD

This invention relates to magnetic tunnel junction (MTJ) devices for memory and external magnetic field-sensing applications. More particularly the invention relates to an MTJ device with improved control of the magnetic field response.

BACKGROUND OF THE INVENTION

A magnetic tunnel junction (MTJ) is a device comprised of two ferromagnetic electrodes separated by a thin insulating layer. The insulating layer is sufficiently thin that quantum-mechanical tunneling of the charge carriers occurs between the ferromagnetic electrodes. The tunneling process is electron spin dependent, which means that the tunneling current across the junction depends on the spin-dependent electronic properties of the ferromagnetic materials and is a function of the relative orientation of the magnetic moments (magnetization directions) of the two ferromagnetic electrodes. The two ferromagnetic electrodes are designed to have different responses to magnetic fields so that the relative orientation of their moments can be varied with an external magnetic field.

Experimental results for tunneling between ferromagnetic electrodes prior to about 1993 were reviewed by R. Meservey et al. in "Spin-polarized Electron Tunneling", *Physics Reports*, Vol. 238, pp. 214–217, and showed only very small responses at room temperature, at best being on the order of 1–2%. The only indications of reasonably-sized responses were from two experiments with scanning tunneling microscopes. One of these employed a 100% spin-polarized $CrO_2$ tip and indicated a polarized current modulation of 40% at room temperature, as described by R. Wiesendanger et al. in "Observation of Vacuum Tunneling of Spin-polarized Electrons with the Scanning Tunneling Microscope", *Physics Review Letters*, Vol. 65, page 247 (1990).

A very large MTJ device with an 18% magnetoresistance response was reported by T. Miyazaki et al. in "Giant Magnetic Tunneling Effect in $Fe/Al_2O_3/Fe$ Junction", *Journal of Magnetism and Magnetic Materials*, Vol. 139, No. L231 (1995). However, the authors report that they could not reproduce their 18% magnetoresistance result. Other junctions fabricated at the same time had responses of only 1–6%. Others have reported MTJ devices with magnetoresistance of up to 18% at room temperature in large $CoFe/Al_2O_3/Co$ junctions as described by J. S. Moodera et al. in "Large Magnetoresistance at Room Temperature in Ferromagnetic Thin Film Tunnel Junctions", *Physics Review Letters*, Vol. 74, page 3273 (1995); and J. S. Moodera and L. S. Kinder in "Ferromagnetic-Insulator-Ferromagnetic Tunneling: Spin Dependent Tunneling and Large Magnetoresistance in Trilayer Junctions", *Journal of Applied Physics*, Vol. 79, page 4724 (1996). The authors hypothesized that a decrease in surface roughness was a key to better results. To achieve this they went to extreme measures for the base electrode growth, combining evaporation onto cryogenically-cooled substrates, the use of a seed layer, and keeping the base electrode extremely thin. The tunnel barrier was formed by cryogenically depositing an Al layer and then warming this and plasma oxidizing it, consuming most of the Al. In the first of these papers, it was reported that the largest junction magnetoresistance change observed at room temperature was 11.8%. In the second paper, the highest change in a junction magnetoresistance was reported to be 18% at room temperature, and it was reported that many junctions had magnetoresistance changes in the range of 14–17% at room temperature. The junction resistances were in the range of hundreds of Ohms to tens of kOhms for junctions with cross-sectional areas of 200×300 $\mu m^2$.

Thus, it is apparent that it has been difficult to make MTJ devices at room temperature with a large enough magnetoresistance response to be useful. The first observation of a magnetoresistance response of the expected magnitude at room temperature occurred in a spin-polarized scanning tunneling microscope. Subsequently in the prior art, only Moodera and coworkers have been able to reproducibly obtain MTJ responses of the expected magnitude at room temperature, but this was only for large devices made using exotic and impractical thin film deposition techniques.

An additional problem with prior art MTJ devices is that the magnetoresistance response versus magnetic field did not exhibit an ideal step-like response to magnetic field. T. Miyazaki et al. in "Large Magnetoresistance Effect in 82Ni-Fe/Al2O3/Co Magnetic Tunneling Junction", *Journal of Magnetism and Magnetic Materials*, Vol. 98, No. L7 (1991), illustrated how it was possible to obtain a step-like magnetoresistance response, but only over a restricted applied magnetic field range. If the applied magnetic field excursion were momentarily too large, the magnetoresistance response characteristic could become inverted.

Recently, in IBM's copending application Ser. No. 08/618,300, filed Mar. 18, 1996, it has been demonstrated how to fabricate a MTJ device with a large room temperature magnetoresistance response and a controlled magnetic response by the use of an antiferromagnetic exchange bias layer to magnetically harden or magnetically pin one of the two ferromagnetic layers in the MTJ device. This MTJ device has an unambiguous and controlled magnetoresistance response to magnetic signals and can be mass fabricated and scaled down in size to deep submicron dimensions. The step-like response, however, may not be symmetric to small positive and negative magnetic fields, but may be offset from zero field by a small field. This is undesirable because it is important that the MTJ memory cell have two well-defined magnetic states (and corresponding resistance values) in zero field.

What is needed is an MTJ device with a response curve that is controlled and optimized in its center field region.

SUMMARY OF THE INVENTION

The invention is a MTJ device usable as a memory cell or an external magnetic field sensor that has a tunneling magnetoresistance response, as a function of applied magnetic field, that is substantially centered about zero field. The magnetic tunnel junction is made up of two ferromagnetic layers, one of which has its magnetic moment fixed and the other of which has its magnetic moment free to rotate, an insulating tunnel barrier layer between the ferromagnetic layers for permitting tunneling current perpendicularly through the layers, and a nonferromagnetic layer located at the interface between the tunnel barrier layer and one of the ferromagnetic layers. The nonferromagnetic layer increases the spacing between the tunnel barrier layer and the ferromagnetic layer at the interface and thus reduces the magnetic coupling between the fixed and free ferromagnetic layers, which has been determined to be the cause of unsymmetric tunneling magnetoresistance response about zero field. Even though the nonferromagnetic interface layer presents nonspin-polarized electronic states at the tunnel barrier layer interface, it unexpectedly does not cause a suppression of the tunneling magnetoresistance.

For a fuller understanding of the nature and advantages of the present invention, reference should be made to the following detailed description taken together with the accompanying figures.

BRIEF DESCRIPTION OF THE DRAWING

FIGS. 1A–1B show a cross-section view and a top view, respectively, of a MTJ device according to the previously-cited copending application configured for a memory cell application, with a self-aligned contact hole through the insulating material surrounding the MTJ element.

FIGS. 2A–2B show a cross-section view and a top view, respectively, of a MTJ device according to the previously-cited copending application configured for a magnetic field-sensing application, but with a planarized, self-aligned contact hole.

DESCRIPTION OF THE PREFERRED EMBODIMENTS

Figure 1C:
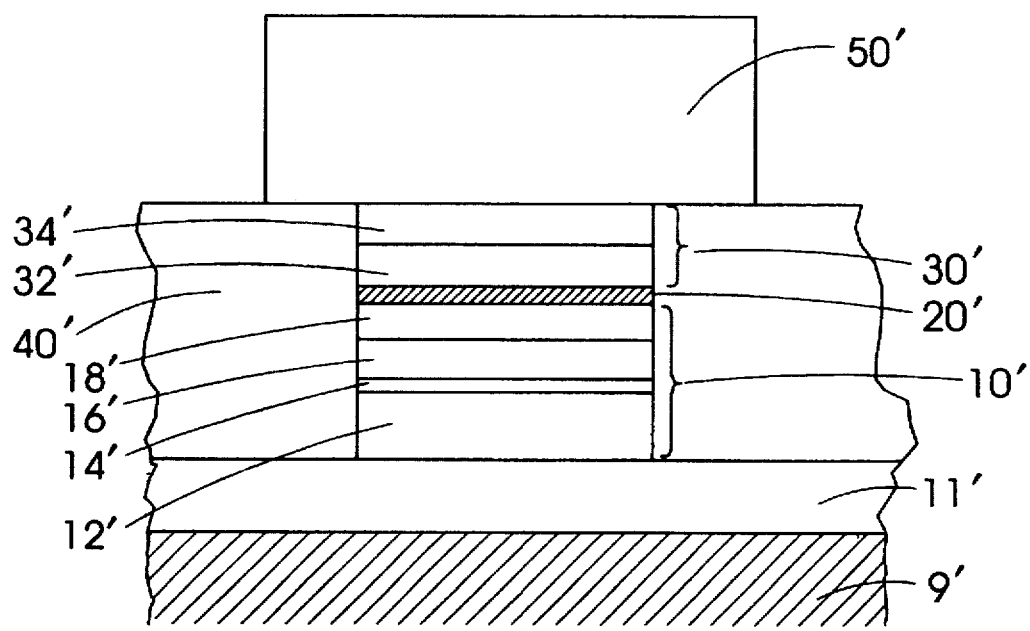
FIG. 1C shows a cross-section view of a MTJ device like that of FIG. 1A, but with a planarized, self-aligned contact hole and all of the layers of the MTJ having the same contiguous side edges.

For purposes of understanding the present invention, the MTJ devices like those in IBM's copending application will first be described with reference to FIGS. 1–5. FIGS. 1A–1B illustrate schematically a MTJ structure suitable for a magnetic memory cell application, as described in the previously-cited copending application. The structure, shown in cross-section in FIG. 1A and from a top view in FIG. 1B, comprises a substrate 9, a base electrode multilayer stack 10, an insulating tunnel barrier layer 20, a top electrode stack 30, an insulating layer 40 with a contact hole through it, and a contact and top wiring layer 50 that itself may be a multilayer structure. The tunnel barrier layer 20 is sandwiched between the two ferromagnetic layer stacks 10 and 30.

The base electrode layer stack 10 formed on substrate 9 includes a first seed layer 12 deposited on substrate 9, a "template" ferromagnetic layer 14 on the seed layer 12, a layer of antiferromagnetic material 16 on the template layer 14, and a "pinned" ferromagnetic layer 18 formed on and exchange coupled with the underlying antiferromagnetic layer 16. The ferromagnetic layer 18 is called the pinned layer because its magnetic moment (magnetization direction) is prevented from rotation in the presence of applied magnetic fields in the desired range of interest for the MTJ device. The top electrode stack 30 includes a "free" ferromagnetic layer 32 and a protective layer 34 formed on the free layer 32. The magnetic moment of the ferromagnetic layer 32 is not pinned by exchange coupling, and is thus free to rotate in the presence of applied magnetic fields in the range of interest, i.e., magnetic fields caused by the write current when the MTJ device is a cell in a memory array (and by the magnetically-recorded data when the MTJ device is a MR read sensor in a magnetic recording head). Both of the ferromagnetic layers 18 and 32 in electrode stacks 10 and 30, respectively, are fabricated so as to have their easy axes of magnetization generally parallel to one another in the same direction parallel to the length of the bottom wiring layer, which is formed as the extensions 11, 13 of base electrode 10 (FIG. 1B). This direction is shown by the arrow 33 in FIG. 1B. The insulating layer 40 has a self-aligned contact hole through to the top of the top junction electrode stack 30. The pinned ferromagnetic layer 18 in stack 10 just beneath the tunnel barrier layer 20 has its magnetization pinned by interfacial exchange coupling with the immediately underlying antiferromagnetic layer 16, which also forms part of base electrode stack 10. For magnetic fields of magnitude comparable to those applied to the memory cell during read and write operations of the cell, there is only one possible orientation for the magnetization of the pinned ferromagnetic layer 18. The free ferromagnetic layer 32 in top electrode stack 30 is anisotropic in its magnetization properties, but its magnetization direction or vector is not pinned. Rather, its magnetization vector can be stably oriented along either direction of the easy axis by the application of a magnetic field in the desired range.

FIG. 1C illustrates the cross-section of a MTJ memory cell similar to that of FIG. 1A except that the base electrode stack 10', the insulating tunnel barrier 20', and the top electrode stack 30' all have the same cross-sectional area. The base electrode stack 10' is formed on wiring lead 11' that is formed on the substrate 9. The insulating layer 40' surrounds the entire MTJ device and extends down to lead 11'. This structure allows for the memory cell to be readily fabricated on top of electronic devices, such as a diode or transistor, for manipulating sense current through the individual magnetic cells.

When the MTJ memory cell is in an array of memory cells connected to read/write circuitry, writing to the cell is accomplished by passing write currents through the top 50 and bottom 11, 13 electrode wiring layers (FIGS. 1A–1B) (or by passing current through a combination of these and/or other write and/or bit lines located near the MTJ cell). When a sufficiently large current is passed through both of these lines, the combined magnetic field that they generate in the vicinity of the free ferromagnetic layer 32 will cause the magnetization direction of the free ferromagnetic layer 32 to rotate from being parallel to antiparallel (or vice versa) to the magnetization direction of the pinned ferromagnetic layer 18. The current levels are selected so that the combined magnetic field they generate exceeds the switching field of the free ferromagnetic layer. The switching field of the free ferromagnetic layer will be determined by a number of factors including the magnetic anisotropy of the free ferromagnetic layer, both intrinsic and that induced by growing the film in a magnetic field, and by the magnetostatic coupling of the free ferromagnetic layer to the fixed ferromagnetic layer. This field, generated by the combined write currents, is selected to be much smaller that the field required to rotate the magnetization of the pinned ferromagnetic layer. The write currents do not pass perpendicularly through the MTJ, which has a high resistance compared to the resistances of wiring layers 50 and 11, 13. The MTJ memory cell is read by passing a sense current perpendicularly through the MTJ from the pinned ferromagnetic layer through the tunnel junction barrier to the free ferromagnetic layer (or vice versa). The state of the memory cell is determined by measuring the resistance of the memory cell when a sense current, much smaller than the write currents, is passed perpendicularly through the MTJ. The self-field of this sense or read current is negligible and does not affect the magnetic state of the memory cell.

The probability of tunneling of charge carriers across the tunnel barrier depends on the relative alignment of the magnetic moments of the two ferromagnetic layers. The tunneling current is spin polarized, which means that the electrical current passing from one of the ferromagnetic layers is predominantly composed of electrons of one spin type (spin up or spin down, depending on the orientation of the magnetization of the ferromagnetic layer). The degree of spin polarization of the current is determined by the electronic properties of the magnetic material comprising the ferromagnetic layer at the interface of the ferromagnetic layer with the tunnel barrier. The first ferromagnetic layer thus acts as a spin filter. The probability of tunneling of the charge carriers depends on the availability of electronic states of the same spin polarization as the spin polarization of the electrical current in the second ferromagnetic layer. Usually, when the magnetic moment of the second ferromagnetic layer is parallel to the magnetic moment of the first ferromagnetic layer, there are more available electronic states than when the magnetic moment of the second ferromagnetic layer is aligned antiparallel to that of the first ferromagnetic layer. Thus, the tunneling probability of the charge carriers is highest when the magnetic moments of both layers are parallel, and is lowest when the magnetic moments are antiparallel. When the moments are arranged, neither parallel nor antiparallel, the tunneling probability takes an intermediate value. Thus, the electrical resistance of the MTJ memory cell depends on the spin polarization of the electrical current and the electronic properties of both of the ferromagnetic layers. As a result, the two possible magnetization directions of the free ferromagnetic layer uniquely define two possible bit states (0 or 1) of the memory cell.

FIGS. 2A–2B illustrate a cross-section and top view, respectively, of a MTJ device for use as an external field sensor, as described in IBM's previously-cited copending application. The structure is similar to the MTJ memory cell device, except that the top junction electrode stack 70 contains a ferromagnetic layer 72 adjacent to the tunnel barrier layer 20 whose easy axis of magnetization is aligned perpendicular, rather than parallel, to the magnetization of the pinned ferromagnetic layer 18 in the bottom electrode stack 10. This allows the MTJ device to function as a sensor for detecting magnetically-recorded data from a magnetic medium, such as a magnetic recording disk. The top wiring layer 50 is spaced from the junction by the planarized insulating layer 40 and is in contact with protective layer 74 in top electrode stack 70. As described above for the MTJ memory cell, for low applied external fields the magnetization direction (arrow 19) of the ferromagnetic layer 18 in the bottom electrode 10 is pinned, while the magnetization direction of the free ferromagnetic layer 72 (shown by arrow 73) is free to rotate in the plane of the substrate 9 toward or away from the direction of arrow 19.

Both the MTJ memory cell and the MTJ magnetic field sensor contain the common elements, a lower electrode 10, an upper electrode 20, and a tunnel barrier 30. These common elements will be referred to as the "MTJ element". The basic thin film structure of the MTJ element for memory and field-sensing applications described above is the same with regard to the sequence of layers and their composition. A schematic representation of the layers making up the basic MTJ element as described above is shown in FIG. 3. This element has a lower electrode stack 10 comprised of 5 nm Ta with 10 nm Cu as the electrical lead layer 11/4 nm $Ni_{60}Fe_{40}$ as the template layer 14/10 nm $Mn_{54}Fe_{46}$ as the antiferromagnetic layer 16/and 6 nm $Ni_{60}Fe_{40}$ with 2 nm Co as the bottom ferromagnetic layer 18. The Cu layer also serves as the seed layer 12. The tunnel barrier 20 is a 1.2 nm thick Al layer plasma oxidized for 120 seconds. The top electrode stack 30 is comprised of 20 nm $Ni_{60}Fe_{40}$/20 nm Cu as the top ferromagnetic layer 32 and electrical lead 50, respectively, without the need for a protective layer (layer 34 in FIG. 1A). This element is prepared by first depositing the lower electrode 10 in a magnetic field applied parallel to the surface of the substrate. This magnetic field serves to orient the easy axis of the initial 4 nm NiFe layer 14, which serves as a template to orient the $Mn_{54}Fe_{46}$ antiferromagnetic layer 16. Layer 16 pins the magnetization direction of the 6 nm $Ni_{60}Fe_{40}$/2 nm Co ferromagnetic layer 18 by exchange coupling. Next, the tunnel barrier layer 20 is formed by depositing and then plasma oxidizing a 1.2 nm Al layer to create a layer of nominally $Al_2O_3$. Subsequently, the top electrode stack 30 is formed. The various layers are deposited by DC magnetron sputter deposition using conventional sputtering techniques with the substrate at room temperature. Typical deposition rates are 2 Å/sec for all the layers with the exception of Al, which is deposited at 1 Å/sec. The lower deposition rate for Al gives rise to smoother Al layers. It is important that the layers in the bottom electrode stack 10 be smooth, and that the $Al_2O_3$ layer 20 be free of pinholes which would otherwise electrically short the junction.

Figure 3:
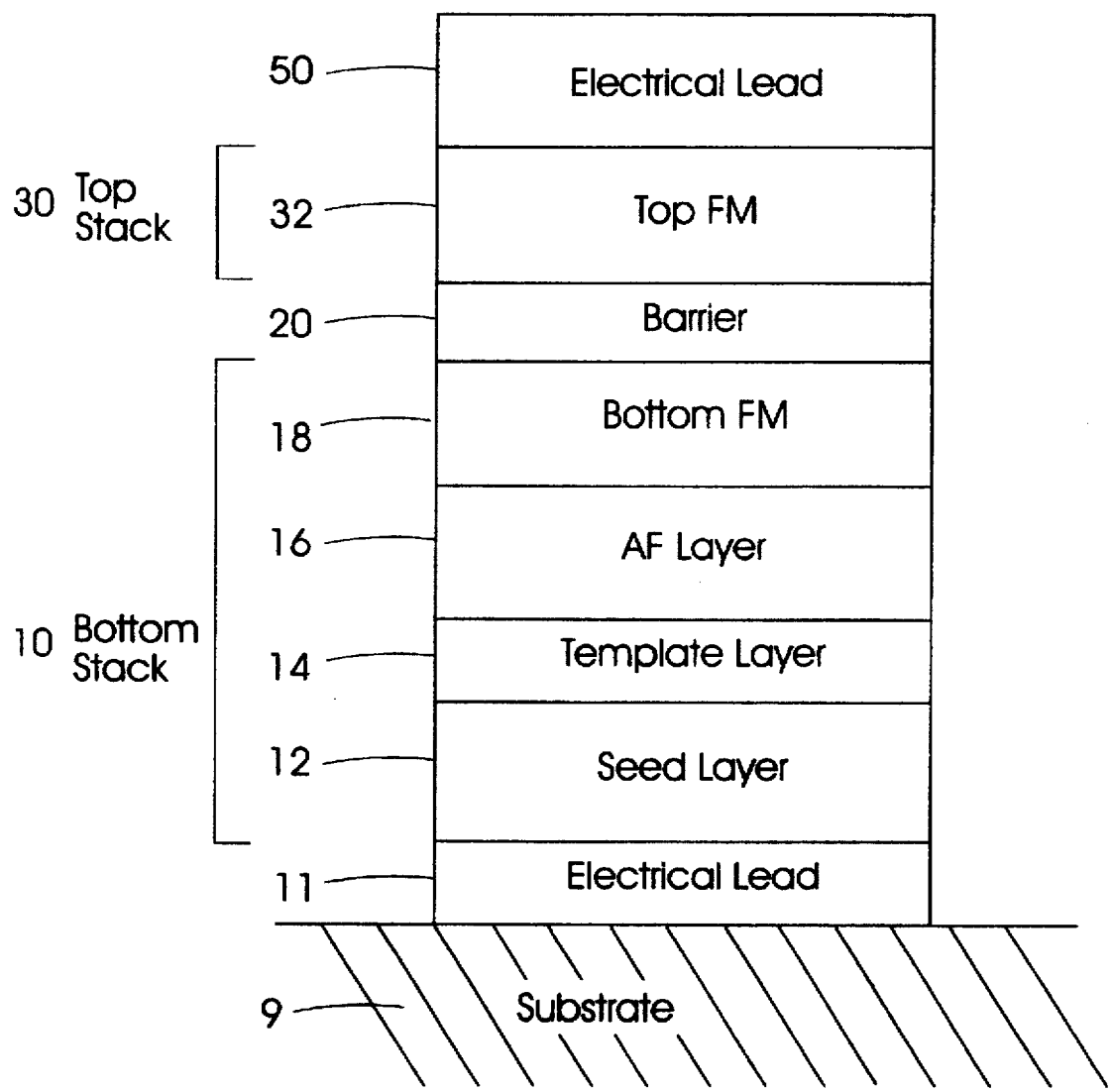
FIG. 3 is a schematic representation of the layers making up the MTJ device of FIG. 1A.
Figure 4:
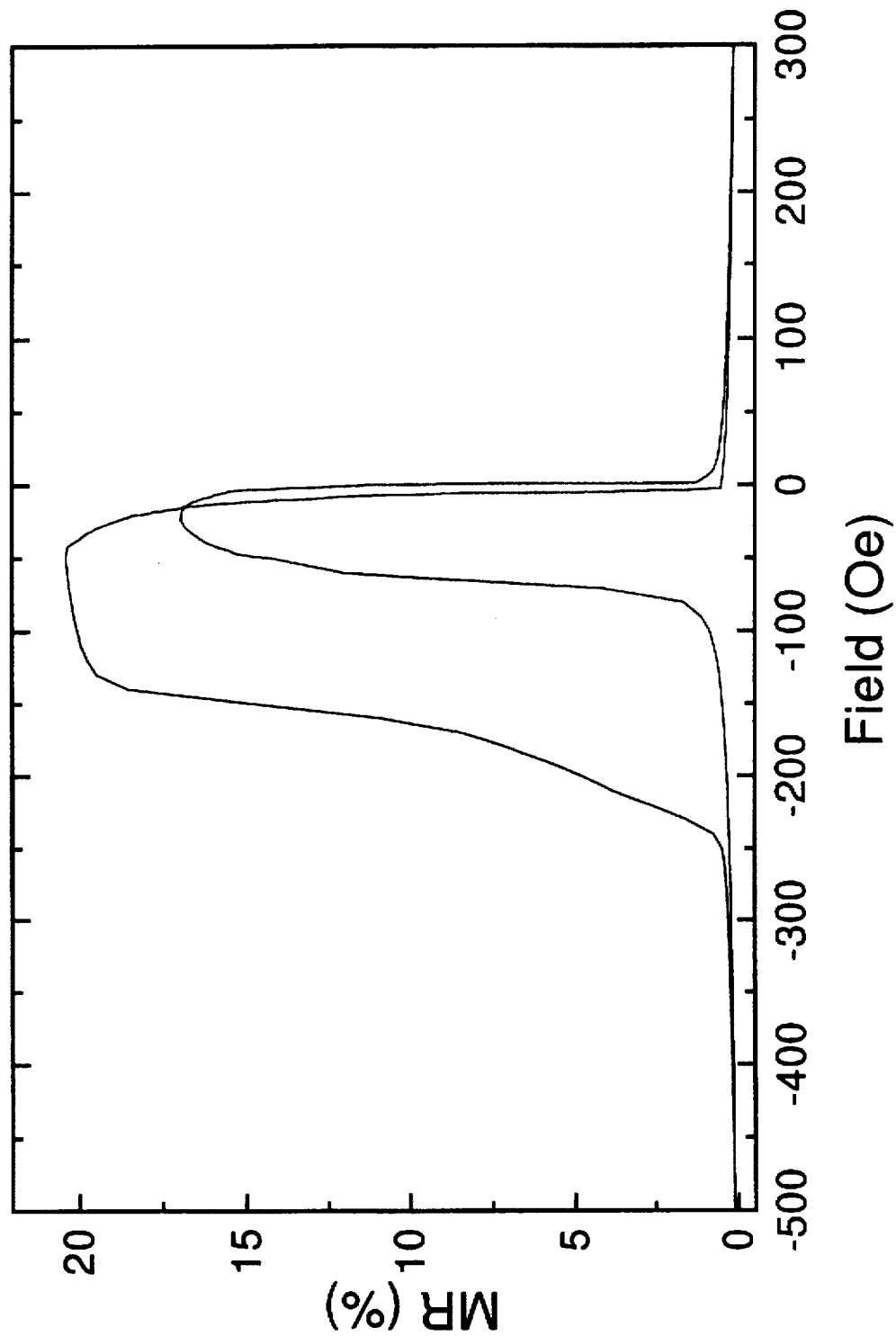
FIG. 4 is a typical magnetoresistance response curve of the MTJ device represented in FIG. 3.

FIG. 4 shows the change in the tunneling resistance (magnetoresistance MR) of the MTJ element of FIG. 3 as a magnetic field is applied parallel to the layers of the MTJ element along the magnetic easy axis of the element. The resistance is measured by passing a current perpendicular to the layers across the tunnel barrier 20. As shown in FIG. 4, there is a large change in the resistance of the device close to zero field. This is caused by the magnetic moment of the free ferromagnetic layer 32 within the top electrode 30, changing its orientation with respect to the magnetic moment of the pinned ferromagnetic layer 18 within the bottom electrode 10. In positive fields, the magnetic moments of the free and pinned ferromagnetic layers are parallel to one another, whereas in small negative fields the moments are approximately antiparallel to one another and the resistance of the MTJ element is approximately 20% higher than the resistance in positive fields. At much larger negative fields, corresponding to the unidirectional exchange bias field $H_B$ of the Mn-Fe antiferromagnetic pinning layer 16, the magnetic moment of the pinned ferromagnetic layer 18 eventually rotates so that it becomes parallel to the applied field and thus parallel to the moment of the free ferromagnetic layer 32 in the top electrode 30, thereby causing a reduction in the resistance of the element.

Figure 5:
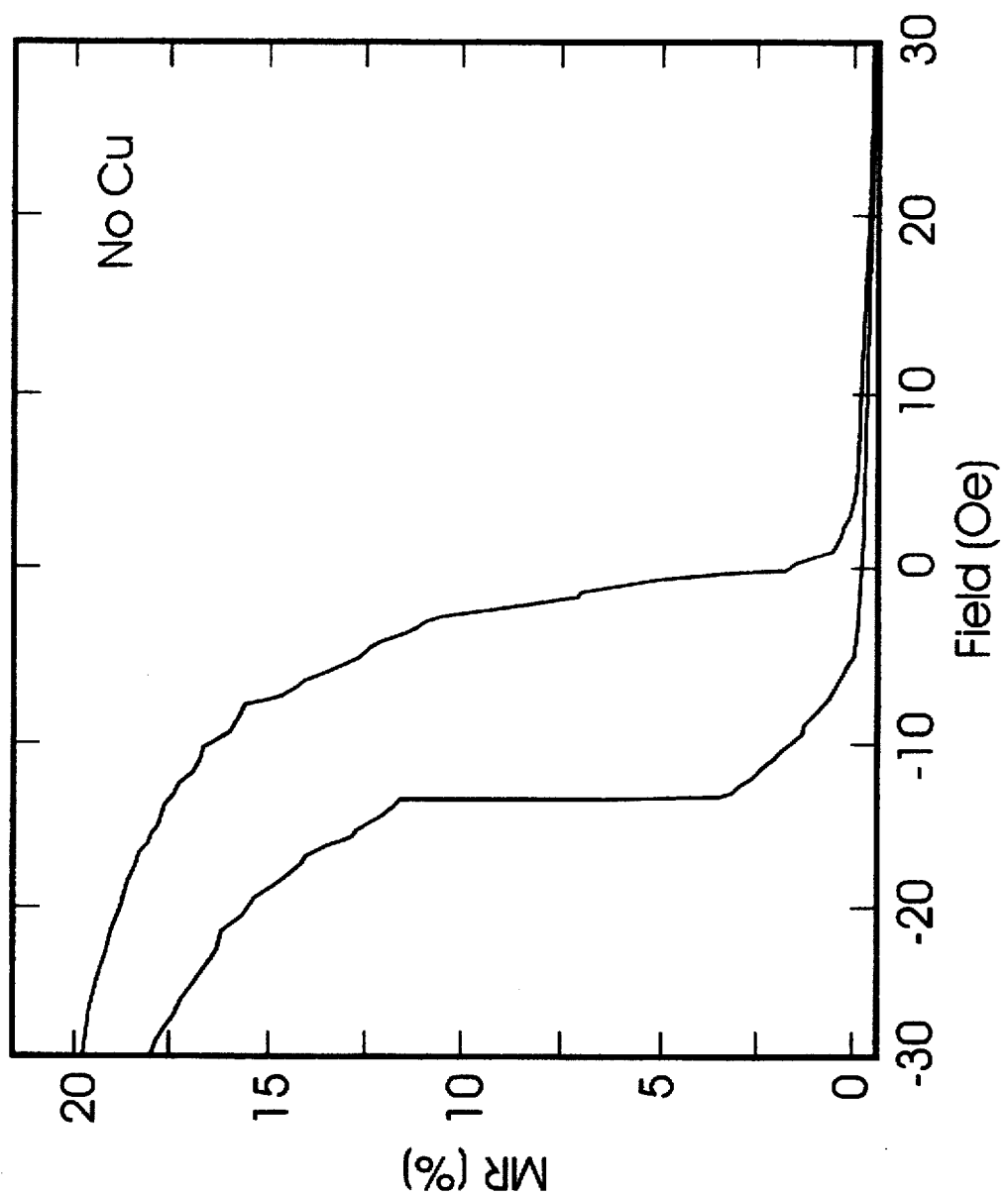
FIG. 5 is an expanded portion of the magnetoresistance response curve of FIG. 4 in the region near zero field illustrating how the response is not centered about zero field.
Figure 6:
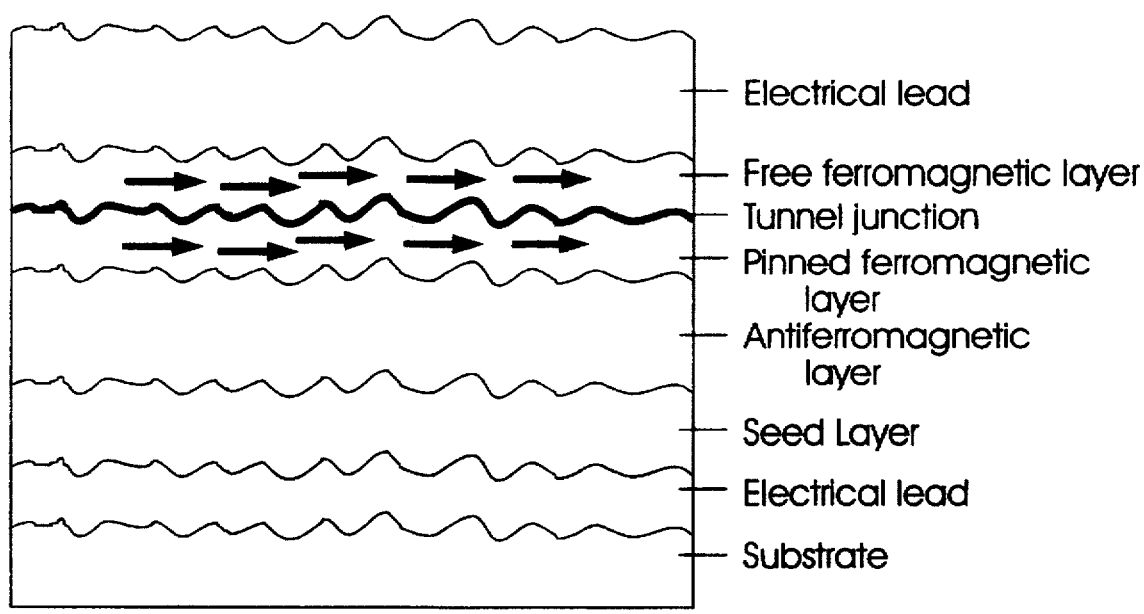
FIG. 6 is a schematic representation of "orange peel" coupling between ferromagnetic layers in the MTJ device due to lack of flatness of the layers.

The operating range of the MTJ element with the response shown by FIG. 4 is limited to small magnetic fields, compared to $H_B$, for either memory cell or field-sensing applications. The detailed behavior of the element in small magnetic fields is shown in FIG. 5. There is some hysteresis of the rotation of the magnetic moment of the free ferromagnetic layer 32 when the magnetic field is applied along the easy axis. More importantly, as can be seen from FIG. 5, the resistance versus field curve is not centered about zero field, but is displaced toward a small negative field. This field, a coupling field $H_i$, is approximately −7.5 Oe in FIG. 5. The asymmetry of the magnetic hysteresis loop of the magnetic moment of the free ferromagnetic layer results from a magnetic coupling of the moment of the free layer 32 to that of the moment of the pinned layer 18. The sign of the interaction field is consistent with a ferromagnetic coupling of the free and pinned ferromagnetic layers. There are several possible mechanisms which could account for such a coupling. Most of these mechanisms are extrinsic and are related to structural defects or deviations from idealized flat layers of the ferromagnetic layers. The coupling could be caused by pinholes through the tunnel barrier. However, this is an unlikely mechanism because pinholes large enough to give rise to a ferromagnetic exchange coupling of the pinned and free ferromagnetic layers would be likely to give rise to an electrical short through the tunnel barrier and a decreased tunnel barrier resistance and magnetoresistance. Another possible and more likely mechanism is what is referred to as the "orange peel" mechanism first proposed by Louis Neel (L. Neel, "Sur un nouveau mode de couplage entre les aimantations de deux couches minces ferromagnetiques", *Comptes Rendues*, Vol. 255, pp. 1676–1681, (1962)). This model requires that there be a correlated roughness or waviness of the interfaces of the free and pinned ferromagnetic layers, such as is depicted in FIG. 6. The correlated roughness, via magnetostatic coupling, can give rise to a ferromagnetic coupling across the tunnel barrier. For the case of a two-dimensional sinusoidal roughness of the ferromagnetic layer interfaces with amplitude r and wavelength $\lambda$, the coupling can be described by the equation $$J=(\pi^2/2^{1/2})(r^2/\lambda)(\mu_0 M_F M_P)\exp(-2\pi 2^{1/2}t/\lambda)$$

where $\mu_0$ is a constant of matter (the permeability of vacuum), t is the average spacing between the ferromagnetic layers, and $M_F$ and $M_P$ are the magnetizations of the free and pinned ferromagnetic layers, respectively. Thus, the "orange peel" coupling will be increased with increased magnetic moment and roughness of the ferromagnetic interface layers, or with decreased separation of the ferromagnetic layers.

Cross-section transmission electron microscopy (XTEM) of structures, such as those with the response of FIGS. 4 and 5, shows that there is considerable roughness of the $Al_2O_3$ tunnel barrier. For example, in a structure of the form 10 nm Si/10 nm Pt/4 nm $Ni_{81}Fe_{19}$/10 nm $Mn_{50}Fe_{50}$/8.5 nm $Ni_{81}Fe_{19}$/1.3 nm Al oxidized for 600 sec/15 nm $Co_{90}Fe_{10}$/10 nm Pt, XTEM shows that the oxidized Al layer with nominal composition $Al_2O_3$ is 1.7 nm thick with significant variations in thickness of approximately ±0.8 nm. Similarly, large variations in $Al_2O_3$ thickness were found in a structure of the form 10 nm Si/10 nm Pt/4 nm $Ni_{81}Fe_{19}$/10 nm $Mn_{54}Fe_{46}$/10 nm $Ni_{81}Fe_{19}$/3 nm Al oxidized for 600 sec/20 nm Co/10 nm Pt with a thicker $Al_2O_3$ layer. Such a scale of interface roughness can account for the values of $H_i$ observed within an "orange peel" model using reasonable values of $\lambda$ in the range of 10–50 nm suggested by the XTEM micrographs.

The performance of the MTJ element for memory cell or field-sensing applications may be degraded by the presence of a ferromagnetic interaction field. For a memory cell application, the state of the memory cell is changed between a "0" and a "1" by changing the direction of magnetization of the free ferromagnetic layer (+ or − with respect to that of the moment of the pinned layer). The required magnetic field is obtained from the self-field of write currents passed simultaneously through neighboring write and bit lines. Usually, one of these lines is unidirectional and the other is bidirectional. The direction of current flow through the bidirectional line determines the state of the memory cell. If the field required to rotate the moment of the free layer from + to − is different from that required to rotate the moment from − to +, the operation of the memory device either becomes more complicated or the write ferromagnetic layer becomes symmetric about zero field for a Cu thickness of approximately 20 Å. $H_i$ systematically decreases with increasing Cu layer thickness. Thus, the magnitude of $H_i$ can be controllably varied and can be reduced to small values.

Figure 9:
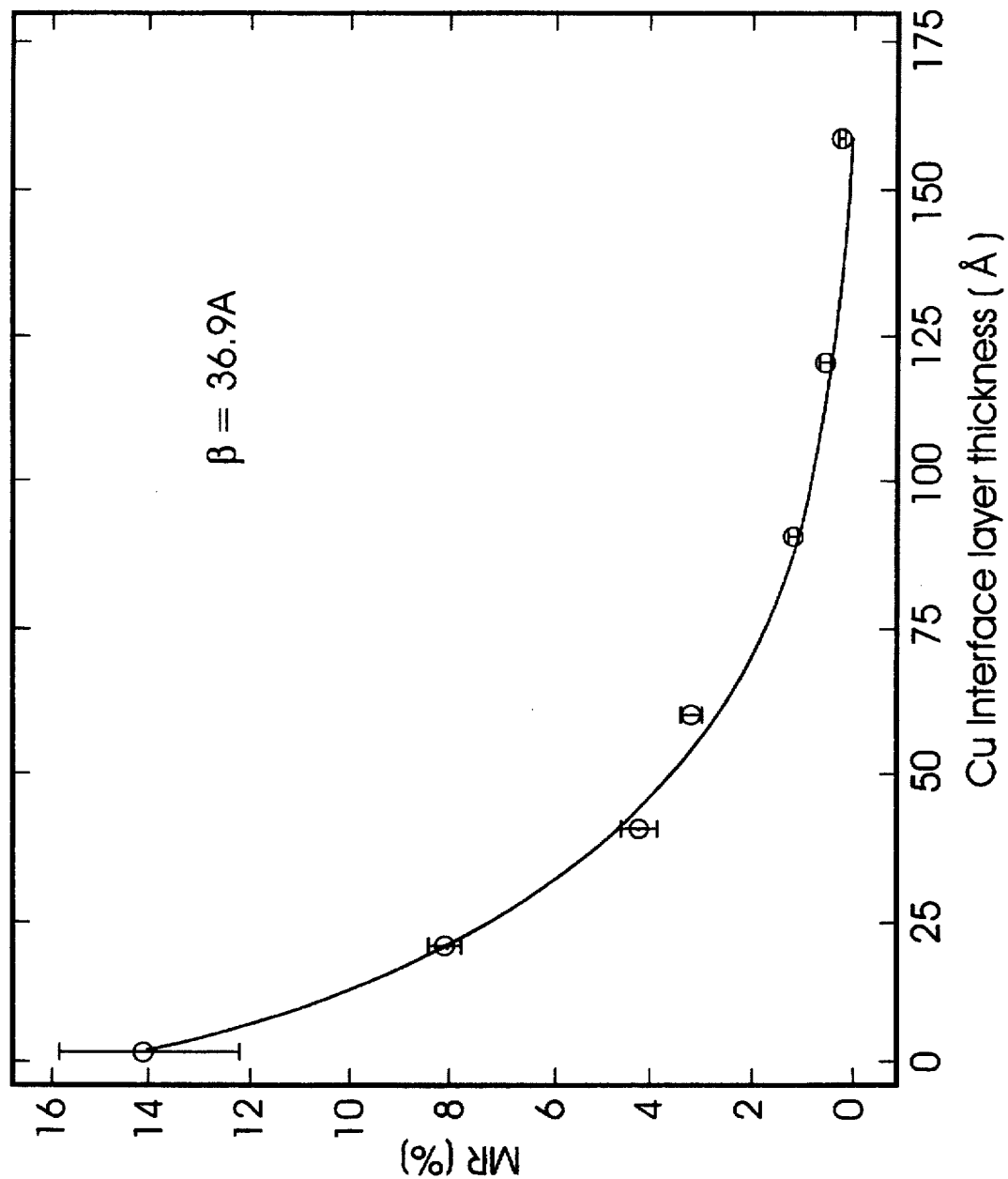
FIG. 9 is a graph of the tunneling magnetoresistance of the MTJ of the present invention as a function of thickness of the Cu interface layer.

The detailed dependence of the magnitude of the tunneling magnetoresistance versus the thickness of the Cu interface layer is shown in FIG. 9. The magnitude of the tunneling magnetoresistance decreases with increasing thickness of the Cu interface layer, but remains substantial even for Cu layers as thick as approximately 10 nm. The dependence of the MR on Cu thickness can be described by the equation MR~exp−$(t_i/\beta_i)$, where $t_i$ is the thickness of the interface layer and $\beta_i$ is an exponential decay length.

The tunneling MR of the MTJ element of FIG. 3 is generally described as resulting from tunneling of spin-polarized electrons from filled states on one side of the tunnel barrier into empty states on the opposite side of the barrier. It is widely believed that the relevant states are those localized within a very short distance (1–2 atomic layers) of the interface. Thus, the insertion of a nonferromagnetic metallic layer with nonspin-polarized electronic states should, in such a view, cause a rapid suppression of the tunneling MR. However, this is clearly not the case, as shown in FIG. 9. One possible explanation is that the tunnel barrier is very rough and that the Cu layers also grow rough. Then the observed MR would result from the fraction of the $Al_2O_3$ layer not covered by Cu. However, this would likely give rise to even larger values of orange peel coupling since the interface roughness of the free ferromagnetic layer would be increased. A second possible explanation is that the electrons propagating across the tunnel barrier and across the Cu interface layer retain their spin polarization over a considerable distance and are eventually spin-dependently scattered at the newly-created Cu/free ferromagnetic layer interface. In such a model, combinations of nonferromagnetic interface layer materials and free ferromagnetic layer margins must be increased. For the data shown in FIG. 5, the MTJ element would have degraded performance as a memory cell because, as a result of the significant coupling field, there are not two well-defined magnetic and corresponding resistance states in zero field.

For a field-sensing application, such as that for a magnetic recording read head where a linear resistance versus field response of the MTJ element is needed, the interaction field $H_i$ of the free and pinned magnetic layers must be balanced with the magnetostatic coupling field $H_m$ of the magnetic moments of the free and pinned ferromagnetic layers. For an MTJ element where only very small currents are required to sense the resistance of the element, the self-field of the sense current will be negligible compared to $H_i$ or $H_m$. Note that $H_m$ will generally increase as the lateral size of the MTJ element is reduced (assuming that the area of the free and pinned ferromagnetic layers remains the same). Thus, it may be necessary to reduce $H_i$ to a small value. For both memory and field-sensing applications, control of $H_i$ is important and the possibility of reducing its value to small values is desirable.

Figure 7:
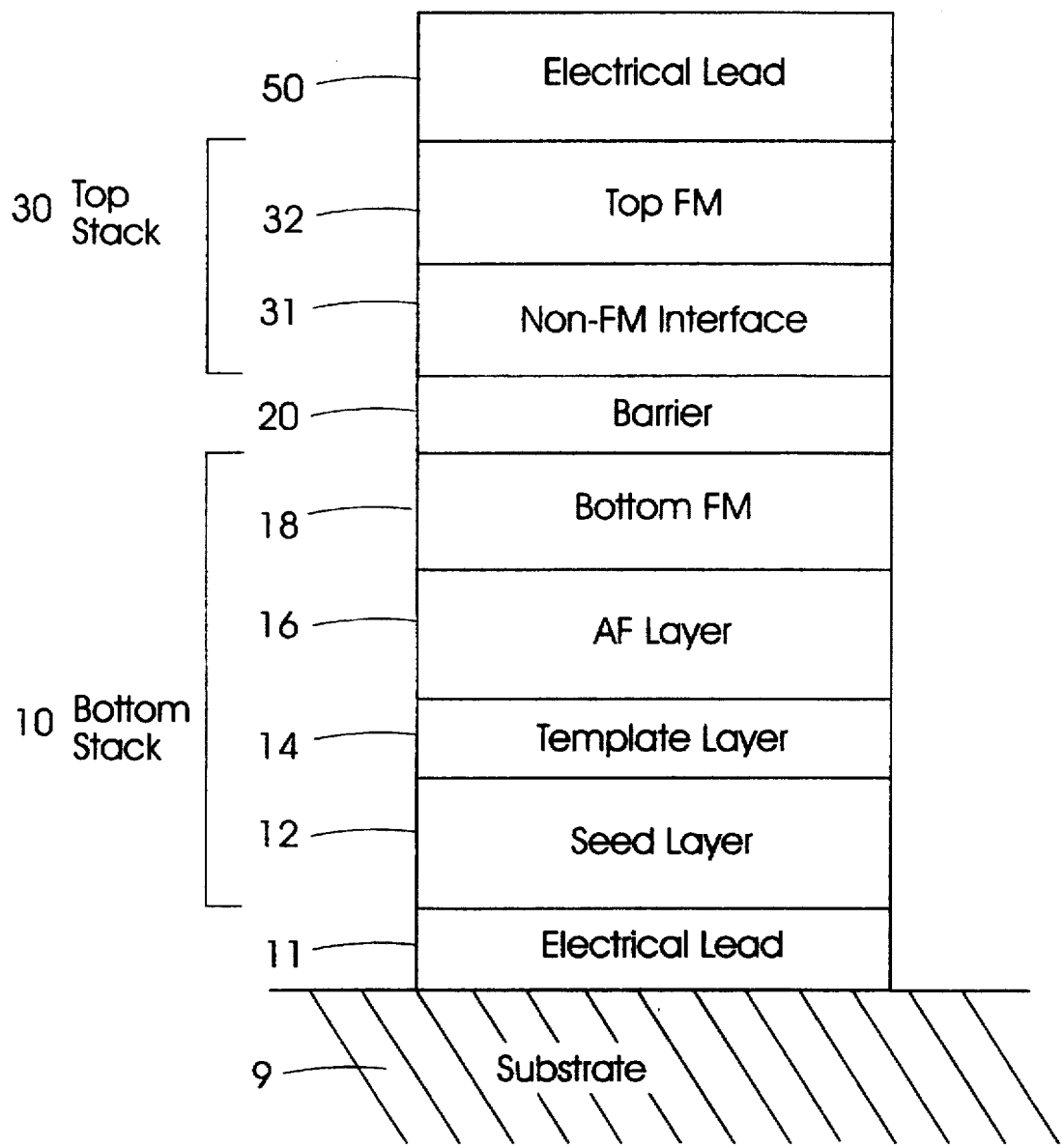
FIG. 7 is a schematic representation of the layers making up the MTJ device of the present invention, for comparison with the schematic representation of the MTJ device in FIG. 3.
Figure 8A:
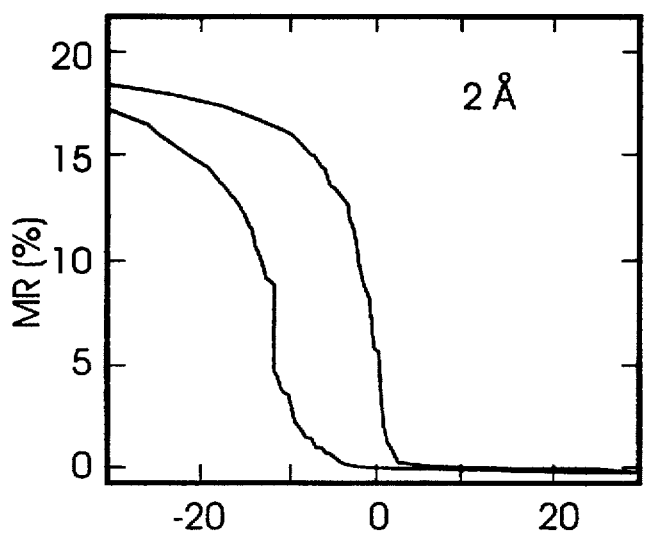
FIGS. 8A–8C are magnetoresistance response curves of the MTJ device of the present invention in the region near zero field for three different thicknesses of a nonferromagnetic interface layer of Cu adjacent to the tunnel barrier layer, for comparison with FIG. 5.
Figure 8B:
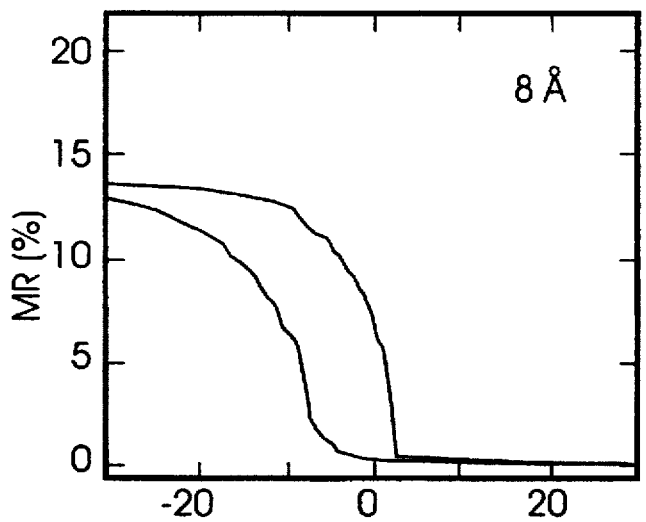
Figure 8C:
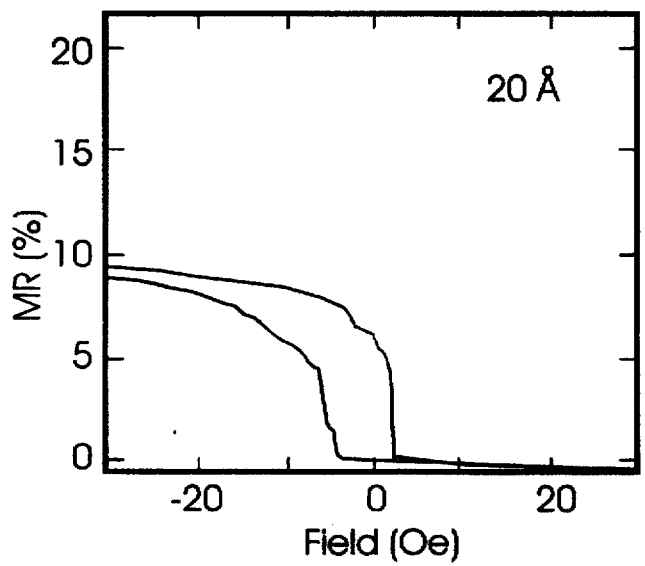
Figure 10:
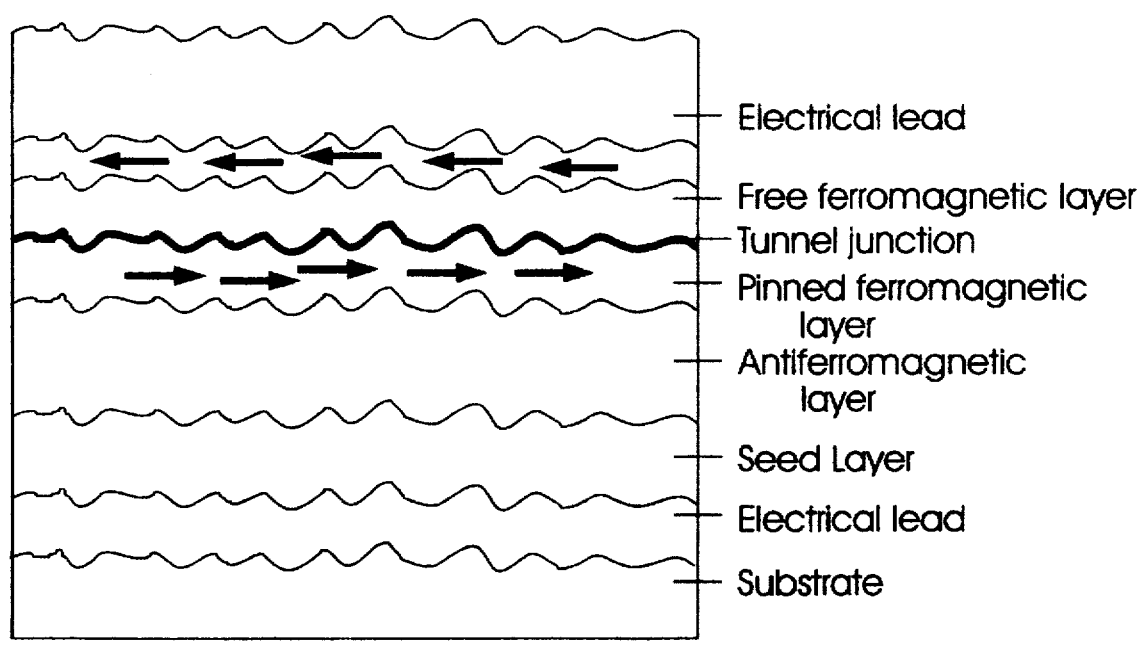
FIG. 10 is a schematic representation of the MTJ layers of the present invention showing the nonferromagnetic interface layer's effect on the "orange peel" coupling between ferromagnetic layers in the MTJ device due to lack of flatness of the layers, for comparison with FIG. 6.

The present invention is a MTJ device with a significantly reduced coupling field $H_i$. The schematic representation of the layers making up this MTJ device is shown in FIG. 7, which can be compared with the MTJ device represented in FIG. 3. A thin nonferromagnetic layer 31 is introduced at the interface between the top of the tunnel barrier and the free ferromagnetic layer. According to the "orange peel" coupling model, increasing the separation t of the pinned and free magnetic layers will reduce the magnitude of the ferromagnetic interaction, $H_i$. This is depicted schematically in FIG. 10. Representative magnetoresistance curves near zero field are shown in FIGS. 8A–8C for MTJ elements according to the present invention with nonferromagnetic interface layers of Cu with thicknesses of 2, 8 and 20 Å, respectively. These MTJ devices are otherwise identical to the MTJ device that produced the response of FIG. 5. As can be seen from the figure, the magnetic hysteresis loop of the free materials which display significant giant magnetoresistance (GMR) in related metallic multilayers would be the most useful materials for the proposed MTJ elements.

The table below is a table of values of the decay length $\beta_i$ with which the magnitude of the magnetoresistive response of a MTJ decreases with increasing thickness of various nonferromagnetic spacer layers, as determined from measurements for various types and thicknesses of ferromagnetic layers. The bottom stack 10 is identical for all structures and is the same as that for FIG. 3.

TABLE

| Nonferromagnetic Interface Layer | Ferromagnetic Layer | Decay Length $\beta$ (Å) |
|---|---|---|
| Al | Co | 2.76 |
| Al | $Ni_{40}Fe_{60}$ | 2.27 |
| Cr | Co | 2.7 |
| Pt | Co | 7.8 |
| Au | Co | 8.4 |
| Au | $Ni_{81}Fe_{19}$ | 7.5 |
| Ag | Co | 30.8 |
| Ag | $Ni_{40}Fe_{60}$ | 40.0 |
| Cu | Co | 36.9 |
| Cu | $Ni_{40}Fe_{60}$ | 30.5 |
| Cu | $Ni_{81}Fe_{19}$ | 30.0 |

As shown by the table and in agreement with the proposed model, the longest decay lengths are found for metallic interface layers which display large GMR values, namely Cu, Ag, and Au, with various free ferromagnetic layers of Co and Ni-Fe. Very short decay lengths are found in Al with free ferromagnetic layers of Co and Ni-Fe, and in Cr with free ferromagnetic layers of Co. These latter combinations also show very small GMR in related metallic multilayers.

The MTJ device of the present invention as described and shown above (FIG. 7) can be formed without a ferromagnetic permalloy template layer 14 providing that the antiferromagnetic exchange bias layer 16 is grown on a suitable underlying layer to encourage the growth of face-centered-cubic (fcc) Mn-Fe as the antiferromagnetic pinning layer. Mn-Fe can be of several different crystallographic structures depending on its method and conditions of formation. Only fcc Mn-Fe gives rise to exchange biasing at room temperature. Other suitable antiferromagnetic exchange biasing materials can be used including, for example, Ni-Mn, Mn-Ir, and Mn-Pt alloys.

Figure 11:
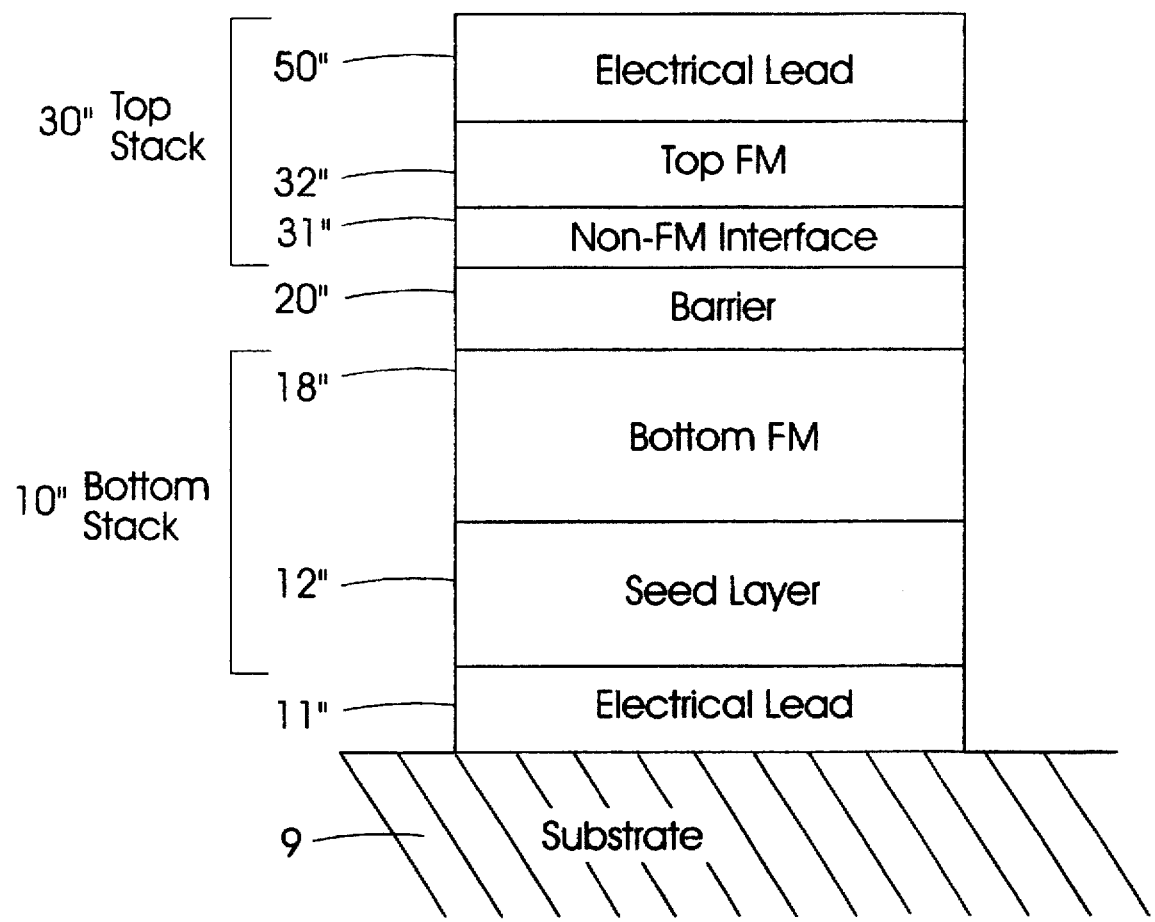
FIG. 11 is a schematic representation of the MTJ device of the present invention with a hard high-coercivity ferromagnetic layer as the fixed ferromagnetic layer.

While the MTJ device described above and shown in FIG. 7 has the nonferromagnetic layer inserted between the top of the $Al_2O_3$ tunnel barrier layer 20 and the free ferromagnetic layer 32, the device can also be formed by inserting the nonferromagnetic layer between the pinned ferromagnetic layer 18 and the tunnel barrier layer 20. Similarly, while the MTJ device of the present invention as described and shown has the pinned ferromagnetic layer 18 on the bottom near the substrate, the device can also be formed by depositing the free ferromagnetic layer 32 first, followed by the tunnel barrier layer 20, the pinned ferromagnetic layer 18, and the antiferromagnetic layer 16. Such a MTJ device would then have the layers essentially inverted from the MTJ device shown in FIG. 7. The nonferromagnetic layer can also be inserted on either side of the tunnel barrier layer in such an inverted MTJ device. In addition, the MTJ device of the present invention with the nonferromagnetic layer at the tunnel barrier layer interface is also capable of use where the pinned ferromagnetic layer has its magnetic moment fixed by a technique other than interfacial exchange coupling with an antiferromagnetic layer, such as is shown in FIG. 11. In this embodiment, the fixed ferromagnetic layer 18" is comprised of a ferromagnetic material which has the property of high coercivity such that, in the presence of applied magnetic fields in the range of interest, the magnetic moment of this layer is essentially fixed or pinned by its intrinsic magnetic anisotropy. In addition, this ferromagnetic material in layer 18" must have a remanent magnetic moment in fields close to zero field, which is a significant fraction of the magnetic moment of this material in large fields. A suitable ferromagnetic material would be an alloy of Co and one or more other elements, such as a CoPtCr ternary alloy (e.g., $Co_{75}Pt_{12}Cr_{13}$) or a CoCrTa ternary alloy or a CoPt binary alloy. As shown in FIG. 11, the magnetic properties of this layer 18" may be affected by the seed layer 12" on which it is grown. For example, a suitable seed layer for CoPtCr would be a layer of Cr.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A magnetic tunnel junction device comprising:
   a first electrode comprising a fixed ferromagnetic layer whose magnetization is fixed in a preferred direction in the presence of an applied magnetic field;
   a second electrode comprising a free ferromagnetic layer whose magnetization is free to rotate in the presence of an applied magnetic field;
   an insulating tunneling layer located between the fixed ferromagnetic layer of the first electrode and the free ferromagnetic layer of the second electrode for permitting tunneling current in a direction generally perpendicular to the fixed and free ferromagnetic layers;

a nonferromagnetic interface layer located between and in contact with the insulating tunneling layer and one of said ferromagnetic layers for increasing the spacing and thereby decreasing the magnetic coupling between the fixed and free ferromagnetic layers; and a substrate, the first and second electrodes, tunneling layer, and nonferromagnetic interface layer being formed on the substrate.

2. The magnetic tunnel junction device according to claim 1 wherein the magnetization directions of the fixed and free ferromagnetic layers are substantially parallel or antiparallel to one another in the absence of an applied magnetic field.

3. The magnetic tunnel junction device according to claim 1 wherein the free ferromagnetic layer's magnetization direction is substantially perpendicular to the pinned ferromagnetic layer's magnetization direction in the absence of an applied magnetic field.

4. The magnetic tunnel junction device according to claim 1 further comprising an antiferromagnetic layer in contact with the fixed ferromagnetic layer of the first electrode for pinning the magnetization of the fixed ferromagnetic layer in its preferred direction.

5. The magnetic tunnel junction device according to claim 1 wherein the fixed ferromagnetic layer has a coercivity sufficiently high such that in the presence of an applied magnetic field, its magnetization is fixed by its intrinsic magnetic anisotropy.

6. The magnetic tunnel junction device according to claim 1 wherein the first electrode is located between the substrate and the insulating tunneling layer.

7. The magnetic tunnel junction device according to claim 1 wherein the nonferromagnetic interface layer is located between and in contact with the insulating tunnel barrier layer and the free ferromagnetic layer.

8. The magnetic tunnel junction device according to claim 7 wherein the material of the free ferromagnetic layer is selected from the group consisting of Co, alloys of Co, and alloys of Ni-Fe.

9. The magnetic tunnel junction device according to claim 1 wherein the material of the nonferromagnetic interface layer is selected from the group consisting of Cu, Ag, and Au.

10. A magnetic tunnel junction memory cell having two magnetic states and usable in a nonvolatile magnetic memory array of memory cells, the array being connected to read/write circuitry for altering and detecting the magnetic state of individual memory cells in the array, the memory cell comprising:

a fixed ferromagnetic layer whose magnetic moment is fixed in a preferred direction in the presence of an applied magnetic field caused by current from the read/write circuitry;

a free ferromagnetic layer whose magnetic moment is free to rotate between directions generally parallel and antiparallel to the magnetic moment of the fixed ferromagnetic layer when exposed to an applied magnetic field caused by current from the read/write circuitry;

an insulating tunnel barrier layer located between the fixed ferromagnetic layer and the free ferromagnetic layer for permitting tunneling current in a direction generally perpendicular to the fixed and free ferromagnetic layers; and a nonferromagnetic interface layer located between and in contact with the insulating tunnel barrier layer and one of said ferromagnetic layers for increasing the spacing and thereby decreasing the magnetic coupling between the fixed and free ferromagnetic layers;

whereby when the ferromagnetic layers are connected to the read/write circuitry, the electrical resistance to current flow through the insulating tunnel barrier layer in a direction generally perpendicular to the ferromagnetic layers is determined by said parallel or antiparallel magnetic moment of said free ferromagnetic layer, the value of said electrical resistance thereby allowing the magnetic state of the memory cell to be determined.

11. The magnetic tunnel junction memory cell according to claim 10 further comprising an antiferromagnetic layer in contact with the fixed ferromagnetic layer for pinning the magnetization of the fixed ferromagnetic layer in its preferred direction by interfacial exchange coupling.

12. The magnetic tunnel junction memory cell according to claim 10 wherein the fixed ferromagnetic layer has a coercivity sufficiently high such that in the presence of an applied magnetic field, its magnetization is fixed by its intrinsic magnetic anisotropy.

13. The magnetic tunnel junction memory cell according to claim 10 wherein the nonferromagnetic interface layer is located between and in contact with the insulating tunnel barrier layer and the free ferromagnetic layer.

14. The magnetic tunnel junction memory cell according to claim 13 wherein the material of the free ferromagnetic layer is selected from the group consisting of Co, alloys of Co, and alloys of Ni-Fe.

15. The magnetic tunnel junction memory cell according to claim 10 wherein the material of the nonferromagnetic interface layer is selected from the group consisting of Cu, Ag, and Au.

16. A magnetic tunnel junction magnetic field sensor for detecting external magnetic fields, the sensor comprising:

a fixed ferromagnetic layer whose magnetic moment is fixed in a preferred direction in the presence of an applied magnetic field in the range of the external magnetic field to be sensed;

a free ferromagnetic layer whose magnetic moment is oriented generally perpendicular to the moment of the fixed ferromagnetic layer in the absence of an applied magnetic field and is free to rotate away from said perpendicular orientation in the presence of an applied magnetic field in the range of the external magnetic field to be sensed;

an insulating tunnel barrier layer located between the fixed ferromagnetic layer and the free ferromagnetic layer for permitting tunneling current in a direction generally perpendicular to the fixed and free ferromagnetic layers; and a nonferromagnetic interface layer located between and in contact with the insulating tunnel barrier layer and one of said ferromagnetic layers for increasing the spacing and thereby decreasing the magnetic coupling between the fixed and free ferromagnetic layers;

whereby when the ferromagnetic layers are exposed to the external magnetic field to be sensed, the moment of the free ferromagnetic layer will change its orientation relative to the moment of the fixed ferromagnetic layer and the electrical resistance to current flow through the insulating tunnel barrier layer in a direction generally perpendicular to the ferromagnetic layers will be altered, thereby allowing the external magnetic field to be detected.

17. The magnetic tunnel junction sensor according to claim 16 further comprising an antiferromagnetic layer in contact with the fixed ferromagnetic layer for pinning the magnetization of the fixed ferromagnetic layer in its preferred direction by interfacial exchange coupling.

18. The magnetic tunnel junction sensor according to claim 16 wherein the fixed ferromagnetic layer has a coercivity sufficiently high such that in the presence of an applied magnetic field with a field strength in the range of the external magnetic field to be sensed, its magnetization is fixed by its intrinsic magnetic anisotropy.

19. The magnetic tunnel junction sensor according to claim 16 wherein the nonferromagnetic interface layer is located between and in contact with the insulating tunnel barrier layer and the free ferromagnetic layer.

20. The magnetic tunnel junction sensor according to claim 17 wherein the material of the free ferromagnetic layer is selected from the group consisting of Co, alloys of Co, and alloys of Ni-Fe.

21. The magnetic tunnel junction sensor according to claim 16 wherein the material of the nonferromagnetic interface layer is selected from the group consisting of Cu, Ag, and Au.

* * * * *

UNITED STATES PATENT AND TRADEMARK OFFICE
CERTIFICATE OF CORRECTION

PATENT NO. : 5,764,567
DATED : June 9, 1998
INVENTOR(S) : Stuart Stephan Papworth Parkin It is certified that error appears in the above-identified patent and that said Letters Patent is hereby corrected as shown below:

Column 1,
After line 10 and before the section entitled "TECHNICAL FIELD," insert the following:

-- RELATED APPLICATION
This application is a continuation-in-part of application Serial No. 08/618,300 filed March 18, 1996, which is now U.S. Patent 5,650,958 issued July 22, 1997. --

Signed and Sealed this

Twenty-eighth Day of August, 2001

*Attest:*

*Attesting Officer*

NICHOLAS P. GODICI
*Acting Director of the United States Patent and Trademark Office*